(12) United States Patent
Lin et al.

(10) Patent No.: US 8,179,490 B2
(45) Date of Patent: May 15, 2012

(54) PIXEL DESIGNS OF IMPROVING THE APERTURE RATIO IN AN LCD

(75) Inventors: Hsiang-Lin Lin, Hsinchu (TW);
Ching-Huan Lin, Hsinchu (TW);
Chih-Hung Shih, Hsinchu (TW);
Wei-Ming Huang, Hsinchu (TW)

(73) Assignee: AU Optronics Corporation, Hsinchu (TW)

( * ) Notice: Subject to any disclaimer, the term of this patent is extended or adjusted under 35 U.S.C. 154(b) by 349 days.

(21) Appl. No.: 12/483,390

(22) Filed: Jun. 12, 2009

(65) Prior Publication Data

US 2010/0315569 A1 Dec. 16, 2010

(51) Int. Cl.
*G02F 1/136* (2006.01)
(52) U.S. Cl. ............................. 349/44; 349/43
(58) Field of Classification Search .......... 349/43, 349/44
See application file for complete search history.

(56) References Cited

U.S. PATENT DOCUMENTS

| | | | | |
|---|---|---|---|---|
| 5,686,734 A * | 11/1997 | Hamakawa et al. | ............ | 257/16 |
| 5,724,107 A * | 3/1998 | Nishikawa et al. | ............ | 349/38 |
| 5,777,701 A | 7/1998 | Zhang | | |
| 5,835,169 A | 11/1998 | Kwon et al. | | |
| 6,118,506 A | 9/2000 | Yamazaki et al. | | |
| 6,124,904 A | 9/2000 | Sato | | |
| 6,531,713 B1 * | 3/2003 | Yamazaki | ........................ | 257/59 |
| 6,890,783 B2 * | 5/2005 | Kimura et al. | .................. | 438/30 |
| 2002/0088982 A1 | 7/2002 | Gu et al. | | |
| 2003/0122158 A1 * | 7/2003 | Murade | ......................... | 257/200 |
| 2004/0036071 A1 * | 2/2004 | Yamazaki et al. | .............. | 257/59 |
| 2004/0147065 A1 * | 7/2004 | Kitakado et al. | ............. | 438/151 |
| 2005/0122458 A1 | 6/2005 | Yang | | |
| 2005/0180232 A1 | 8/2005 | Arao | | |
| 2006/0215071 A1 | 9/2006 | Shin et al. | | |
| 2008/0111138 A1 * | 5/2008 | Lin et al. | ........................ | 257/79 |
| 2008/0227242 A1 * | 9/2008 | Tsai et al. | ..................... | 438/158 |
| 2010/0019998 A1 * | 1/2010 | You et al. | ........................ | 345/87 |
| 2011/0025923 A1 * | 2/2011 | Tsubata | ........................ | 348/731 |

* cited by examiner

*Primary Examiner* — K. Cyrus Kianni
(74) *Attorney, Agent, or Firm* — Morris Manning & Martin LLP; Tim Tingkang Xia, Esq.

(57) ABSTRACT

This invention in one aspect relates to a pixel structure. In one embodiment, the pixel structure includes a scan line formed on a substrate and a data line formed over the substrate defining a pixel area, a switch formed inside the pixel area on the substrate, a shielding electrode having a first portion and a second portion extending from the first portion, and formed over the scan line, the data line and the switch, where the first portion is overlapped with the switch and the second portion is overlapped with the data line, and a pixel electrode having a first portion and a second portion extending from the first portion, and formed over the shielding electrode in the pixel area, where the first portion is overlapped with the first portion of the shielding electrode so as to define a storage capacitor therebetween and the second portion has no overlapping with the second portion of the shielding electrode.

12 Claims, 9 Drawing Sheets

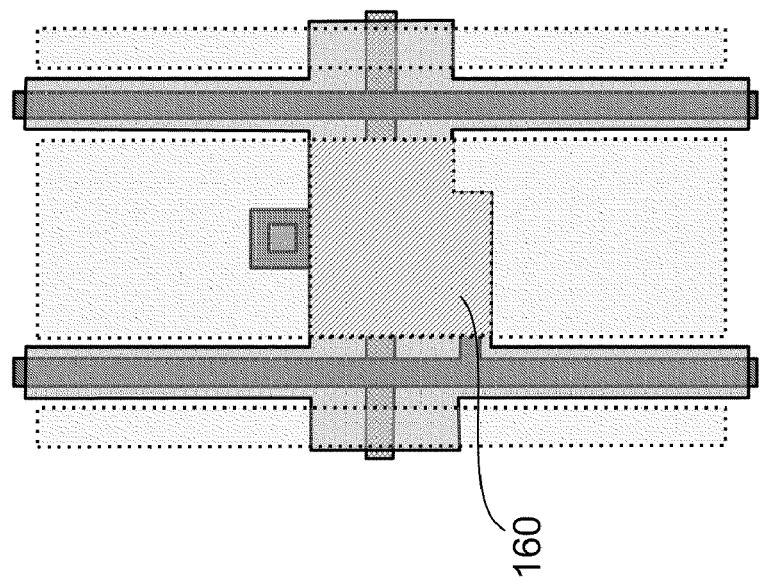
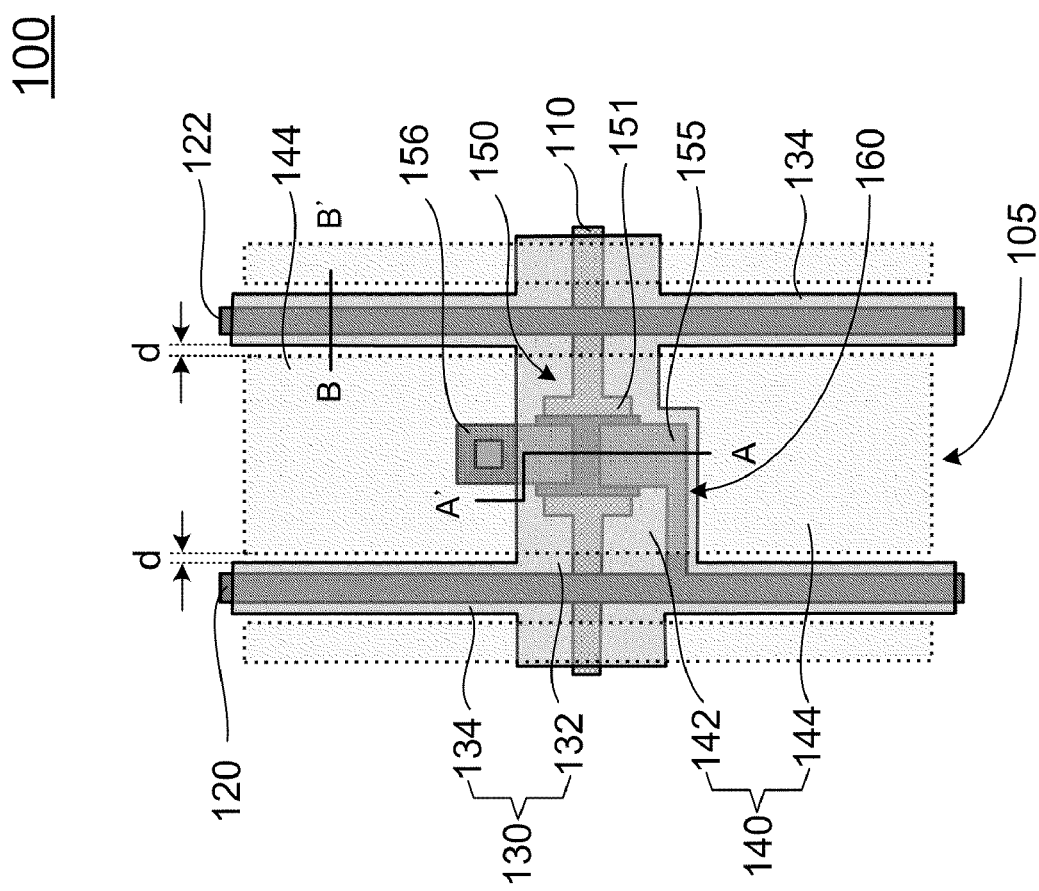
Fig. 1a
Fig. 1b

440

(b)

(a)

400

PIXEL DESIGNS OF IMPROVING THE APERTURE RATIO IN AN LCD

FIELD OF THE INVENTION

The present invention relates generally to a liquid crystal display (LCD), and more particularly, to an LCD that utilizes a pixel design to improve the aperture ratio thereof and methods of fabricating same.

BACKGROUND OF THE INVENTION

A liquid crystal display (LCD) device includes an LCD panel formed with liquid crystal cells and pixel structures with each associating with a corresponding liquid crystal cell and having a scan line, a data line, a pixel electrode, and a switch having a gate, a source and a drain electrically connected to the scan line, the data line and the pixel electrode, respectively. Generally, an aperture ratio of pixels directly affects utilization of backlight and panel brightness of an LCD. In a pixel structure, a capacitance, $C_{pd}$, between the pixel electrode and the data line is one of major factors affecting the aperture ratio. The capacitance $C_{pd}$ is determined by the distance between the pixel electrode and the data line. The closer the pixel electrode and the data line are, the larger the capacitance $C_{pd}$ is. However, when the pixel electrode and the data line are too close, a cross talk may be generated by the coupling effect between the charged potential on the pixel electrode and the signal voltages transmitted in the data line, which deteriorates the display quality of the LCD. Generally, the data line is always designed to be separated from the pixel electrode for a distance so as to avoid the cross talk. However, the longer the distance between the data line and the pixel electrode is, the more greatly the aperture ratio of the pixel decreases.

To reduce the cross talk of the pixel structure and maintain the aperture ratio of the pixel structure at a certain level, various designs of pixel structures have been developed. For example, one of the pixel designs is the utilization of a shielding electrode disposed between the pixel electrode and the data line to reduce the effect of capacitance $C_{pd}$. As shown in FIG. 6, in the pixel design, the shielding electrode 640 is formed over the date line 620 and the switch 650, but under the pixel electrode 610, such that the shielding electrode 640 has an area 660 that is overlapped with the peripheral portion of the pixel electrode 610. For such a pixel design, the overlapped area 660 of the shielding electrode 640 with the peripheral portion of the pixel electrode 610 is configured to generate a storage capacitance therebetween, thereby improving the aperture ratio thereof, in comparison with a pixel design without a shielding electrode. However, the shielding electrode 640 is usually formed of an opaque conductive material because of impedance. Thus, the use of the overlapped area 660 of the shielding electrode 640 with the peripheral portion of the pixel electrode 610 to generate the storage capacitance itself reduces certain amounts of the aperture ratio.

Additionally, some pixel designs also utilize a comb-like pixel electrode 710 to assist with the orientations of liquid crystals, as shown in FIG. 7. In the pixel design 700, the storage capacitance area 760 formed by overlapping the shielding electrode 740 with the peripheral portion of the pixel electrode 710 is reduced because of the comb-like structure of the pixel electrode 710. Increasing the storage capacitance area, thereby increasing the storage capacitance, will reduce the aperture ratio.

Therefore, a heretofore unaddressed need exists in the art to address the aforementioned deficiencies and inadequacies.

SUMMARY OF THE INVENTION

The present invention, in one aspect, relates to a pixel structure usable in a liquid crystal display (LCD). In one embodiment, the pixel structure has a scan line formed on a substrate and a data line formed over the substrate, and a pixel area associated with the data line and the scan line. The pixel structure also has a switch formed inside the pixel area on the substrate.

Furthermore, the pixel structure has a shielding electrode having a first portion and a second portion extending from the first portion, and formed over the scan line, the data line and the switch, where the first portion is overlapped with the switch and the second portion is overlapped with the data line. The second portion of the shielding electrode is configured to shield the electric field produced from the data line. In one embodiment, the shielding electrode is made of an opaque, conductive material.

Additionally, the pixel structure has a pixel electrode having a first portion and a second portion extending from the first portion, and formed over the shielding electrode in the pixel area. The first portion is overlapped with the first portion of the shielding electrode so as to define a storage capacitor therebetween. The second portion has no overlapping with the second portion of the shielding electrode. In one embodiment, the pixel electrode has a comb-like shape. The pixel electrode is made of a transparent, conductive material.

The pixel structure also has a first insulation layer formed between the scan line and the data line, a second insulation layer formed between the data line and the shielding electrode; and a third insulation layer formed between the shielding electrode and the pixel electrode.

The switch has a gate, a source and a drain electrically connected to the scan line, the data line and the pixel electrode, respectively. The gate of the switch is formed on the substrate, and the source and drain of the switch are formed between the first insulation layer and the second insulation layer.

In one embodiment, the switch further includes a semiconductor layer formed between the source and drain and the first insulation layer. The semiconductor layer includes a channel layer formed on the first insulation layer and an ohmic contact layer formed on the channel layer. In one embodiment, the channel layer a formed of amorphous silicon (a-Si), and the ohmic contact layer is formed of an $N^+$ doped or CVD deposited semiconductor. The switch is corresponding to a thin film transistor (TFT).

In another aspect, the present invention relates to a liquid crystal display (LCD) comprising a plurality of the pixel structures, arranged in a matrix.

In yet another aspect, the present invention relates to method for fabricating a pixel structure. In one embodiment, the method includes the following steps: at first, a substrate is provided. A scan line and a gate electrode are formed on the substrate. The gate electrode is formed to be electrically connected to the scan line. Then, a first insulation layer is formed on the substrate, which overlays the scan line and the gate electrode.

Then, a semiconductor layer is formed on the first insulation layer and overlapped with the gate electrode. In one embodiment, the step of forming the semiconductor layer may comprises the steps of forming a channel layer on the first insulation layer, forming an ohmic contact layer on the channel layer, and patterning the channel layer and the ohmic contact layer to form the semiconductor layer, where the ohmic contact layer is patterned to have a first portion and a second portion separated from the first portion. Next, a data line is formed on the first insulation layer. Meanwhile, a source electrode and a drain electrode are formed on the first portion and the second portion of the ohmic contact layer, respectively. In alternative steps, after forming the channel layer and the ohmic contact layer, a step of pre-patterning the channel layer and the ohmic contact layer can be performed to define the shape of the channel layer. A step of patterning the channel layer and the ohmic contact layer can be performed after forming the source electrode and the drain electrode, wherein the ohmic contact layer is patterned to have a first portion and a second portion separated from the first portion, and the source electrode and the drain electrode are substantially in contact with the first portion and the second portion of the ohmic contact layer, respectively. In further alternative steps, a half-tone process is employed, the step of patterning the channel layer and the ohmic contact layer can be performed after forming the source electrode and the drain electrode with a half-tone mask, wherein the ohmic contact layer is patterned to have a first portion and a second portion separated from the first portion, and the source electrode and the drain electrode are substantially in contact with the first portion and the second portion of the ohmic contact layer, respectively. The gate electrode, the channel layer, the ohmic contact layer, the source electrode and the drain electrode define a switch.

The next step is to form a second insulation layer on the first insulation layer, which overlays the data line and the switch. A shielding electrode is formed on the second insulation layer. The shielding electrode has a first portion overlapped with the switch, and a second portion extending from the first portion and overlapped with the data line.

Next, a third insulation layer is formed on the second insulation layer, which overlays the shielding electrode. Then, a pixel electrode is formed on the third insulation layer. The pixel electrode has a first portion overlapped with the first portion of the shielding electrode so as to define a storage capacitor therebetween, and a second portion extending from the first portion having no overlapping with the second portion of the shielding electrode.

The source electrode and the drain electrode of the switch are electrically connected to the data line and the pixel electrode, respectively.

The channel layer a formed of amorphous silicon (a-Si), and wherein the ohmic contact layer is formed of an $N^+$ doped or CVD deposited semiconductor.

In one embodiment, the shielding electrode comprises an opaque, conductive material.

The pixel electrode has a comb-like shape. The pixel electrode is made of a transparent, conductive material.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, wherein:

FIGS. 1a-1c show schematically a pixel structure according to one embodiment of the present invention, (a) a top view, (b) a top view with highlighting a storage capacitance, and (c) a cross-sectional view;

DETAILED DESCRIPTION OF THE INVENTION

Figure 1C:
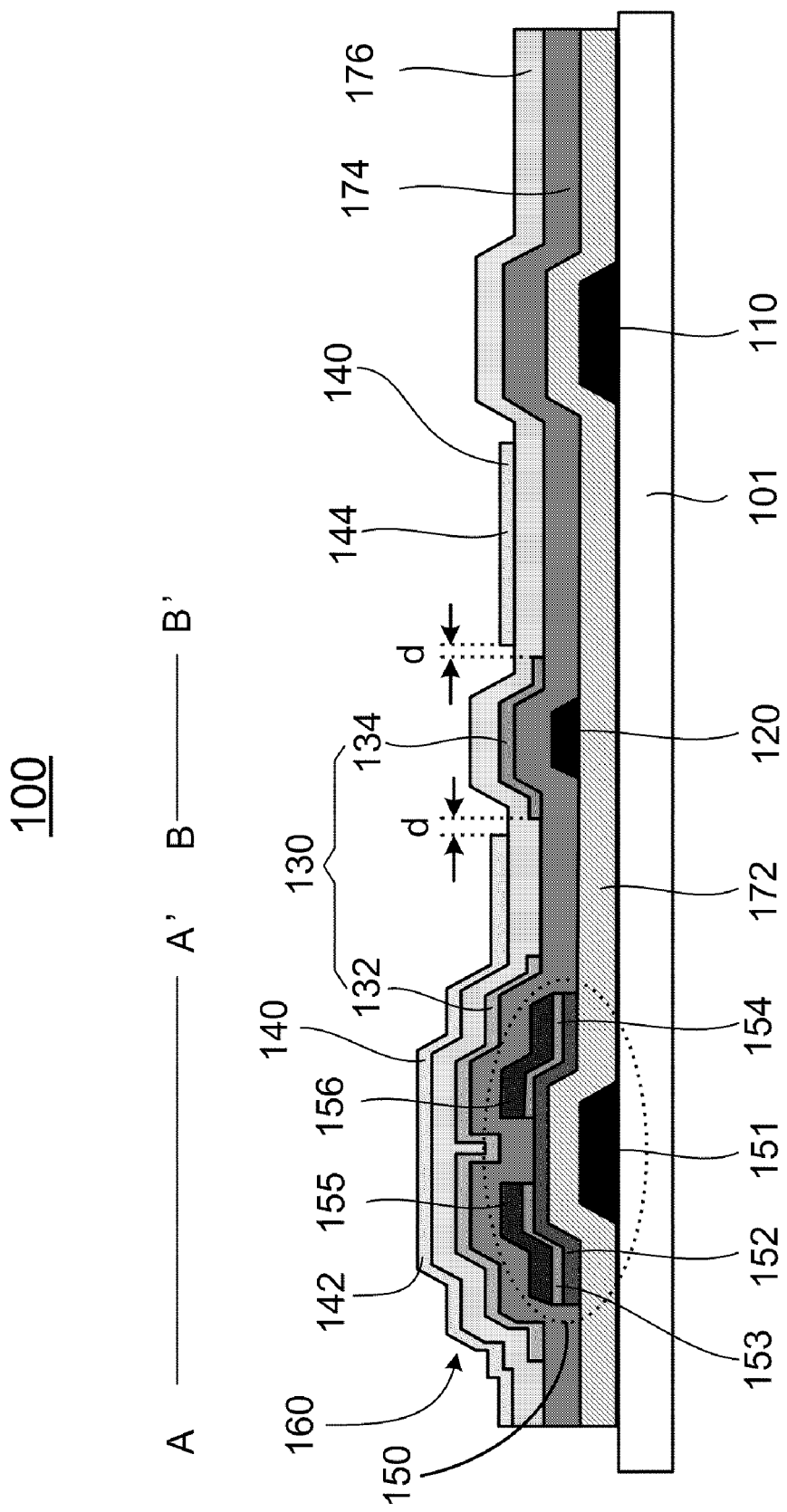

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Without intent to limit the scope of the invention, exemplary apparatuses and methods and their related results according to the embodiments of the present invention are given below.

The description will be made as to the embodiments of the present invention in conjunction with the accompanying drawings in FIGS. 1-5. In accordance with the purposes of this invention, as embodied and broadly described herein, this invention, in one aspect, relates to a pixel structure, and a liquid crystal display (LCD) comprising a plurality of the pixel structures, arranged in a matrix.

Referring to FIGS. 1a-1c, the pixel structure 100 has a scan line 110 and a data line 120, a pixel area 105 defined between the data line 120 and the data line 122 of its adjacent pixel structure (not shown), a switch 150, a shielding electrode 130 and a pixel electrode 140. The switch 150 and the pixel electrode 140 are formed inside the pixel area 105. The pixel structure 100 further has a first insulation layer 172, the second insulation layer 174 and the third insulation layer 176. The switch 150 has a gate electrode 151, a source electrode 155 and a drain electrode 156 electrically connected to the scan line 110, the data line 120 and the pixel electrode 140, respectively. Additionally, the switch 150 also includes a channel layer 152, an ohmic contact layer 153/154 formed between the gate electrode 151 and the source electrode 155 and the drain electrode 156. In one embodiment, the channel layer 152 is formed of amorphous silicon (a-Si), and the ohmic contact layer 153/154 is formed of an $N^+$ doped or CVD deposited semiconductor. The switch 150 is corresponding to a thin film transistor (TFT).

The gate electrode 151, the data line 120 and the scan line 110 are spatially formed on the substrate 101. The gate electrode 151 defines a switch area therearound. The first insulation layer 172 is formed on the substrate 101 and overlays the scan line 110 and the gate electrode 151. The channel layer 152 is formed on the first insulation layer 172. The channel layer 152 layer is overlapped with the gate electrode 151. The ohmic contact layer 153/154 is formed on the channel layer 152. The ohmic contact layer 153/154 has a first portion 153 and a second portion 154 separated from the first portion 153. The data line 120 and the source electrode 155 and the drain electrode 156 are formed simultaneously. The source electrode 155 and the drain electrode 156 are formed on the first portion 153 and the second portion 154 of the ohmic contact layer 153/154, respectively.

The second insulation layer 174 is formed on the first insulation layer 172 and overlays the data line 120 and the switch 150. The shielding electrode 130 is formed on the second insulation layer 174. The shielding electrode 130 includes a first portion 132 that is overlapped with the switch 150, and a second portion 134 that extends from the first portion 132 and is overlapped with the data line 120. The third insulation layer 176 is formed on the second insulation layer 174 and overlays the shielding electrode 130. Considering the impedance of the pixel, the shielding electrode 130 is usually made of an opaque, conductive material.

The pixel electrode 140 is formed on the third insulation layer 176. The pixel electrode 140 includes a first portion 142 overlapped with the first portion 132 of the shielding electrode 130, and a second portion 144 extending from the first portion 142. The pixel electrode 140 is made of a transparent, conductive material, such as indium zinc oxide (IZO), amorphous indium tin oxide (ITO), poly ITO, or the like.

According to the present invention, the switch 150 is formed inside the pixel area 105. The first portion 132 of the shielding electrode 130 and the first portion 142 of the pixel electrode 140 and the third insulation layer 176 between the first portion 132 of the shielding electrode 130 and the first portion 142 of the pixel electrode 140 are configured as a storage capacitor 160 to generate a storage capacitance, i.e., the storage capacitance area 160 is defined by the area of the shielding electrode 130 and the pixel electrode 140 and the third insulation layer 176 between the shielding electrode 130 and the pixel electrode 140 located over the switch 150. Furthermore, the second portion 144 of the pixel electrode 140 has no overlapping with the second portion 134 of the shielding electrode 130. As shown in FIGS. 1*a* and 1*c*, the second portion 144 of the pixel electrode 140 and the second portion 134 of the shielding electrode 130 are separated by a gap, d≧0, and preferably, d≈0. Accordingly, the pixel area 105 can be optimally utilized to transmit light therethrough the pixel electrode 144, thereby increasing the aperture ratio of the pixel.

In this exemplary embodiment, the switch 150 is formed inside the central region of the pixel area 105. In practice, the switch 150 can also be formed inside the other region of the pixel area 105.

Figure 2:
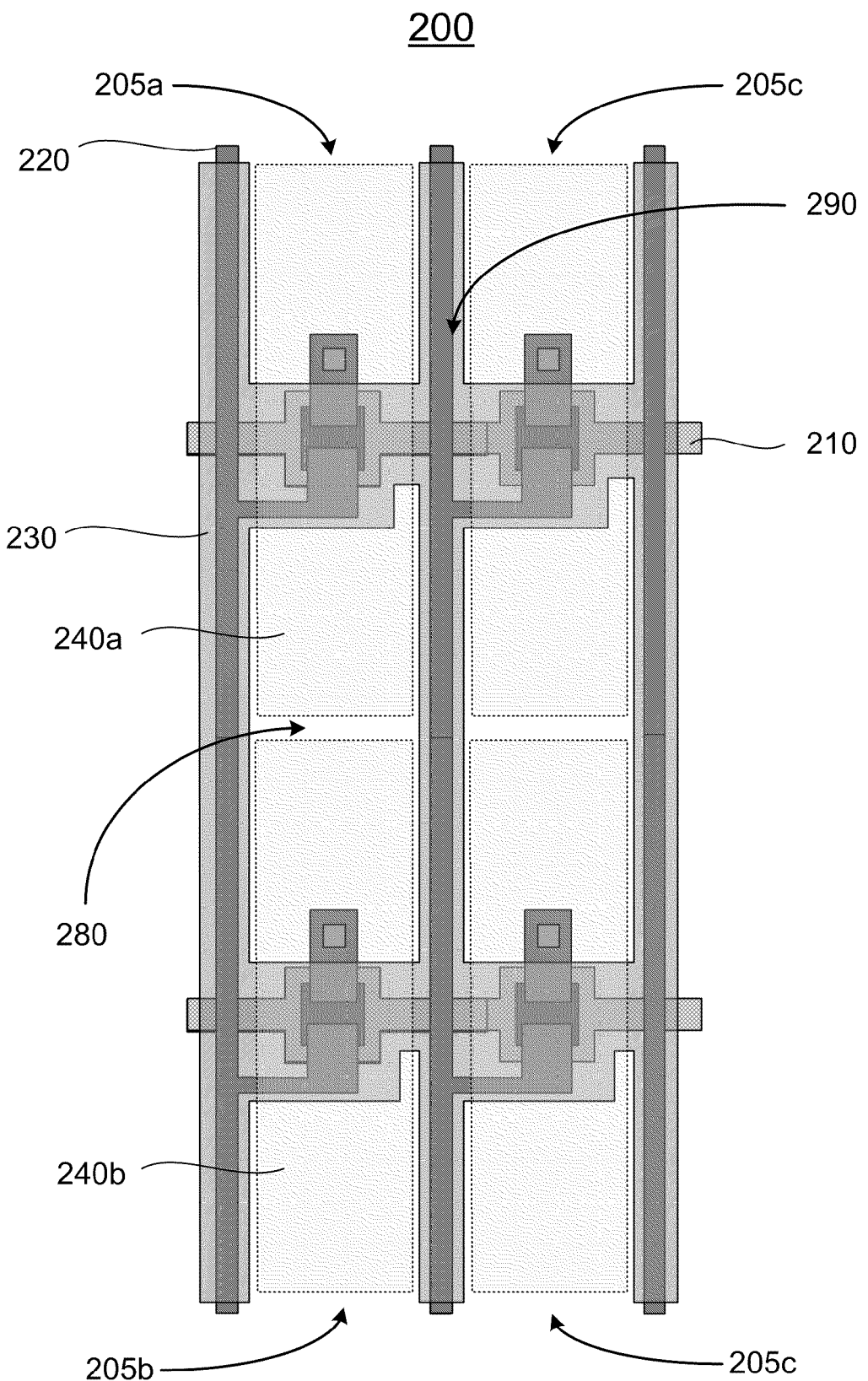
FIG. 2 shows partially a pixel design including 4 pixels according to another embodiment of the present invention.

FIG. 2 shows a pixel design 200 according to one embodiment of the present invention. In the exemplary pixel design 200, only four pixel structures 205*a*, 205*b*, 205*c* and 205*d* are shown and arranged in a matrix. Each pixel structure 205*a*, 205*b*, 205*c* or 205*d* is essentially same as that shown in FIG. 1*a*-1*c*. The pixel electrodes 240*a* and 240*b* of each two neighboring pixel structures 205*a* and 205*b* along a direction of the data lines 220 are separated be a first space 280, and the pixel electrodes 240*a* and 240*c* of each two neighboring pixel structures 205*a* and 205*c* along a direction of the scan lines 210 are separated be a second space 290. The data lines 220 are located in the second space 290. Further, the shielding electrodes 230 are formed in the second space 290 and overlap with the data lines 220. As shown in FIG. 2, no portion of the shielding electrodes 230 is formed in the first space 280.

In practice, any number of the pixel structures can be utilized.

Figure 3:
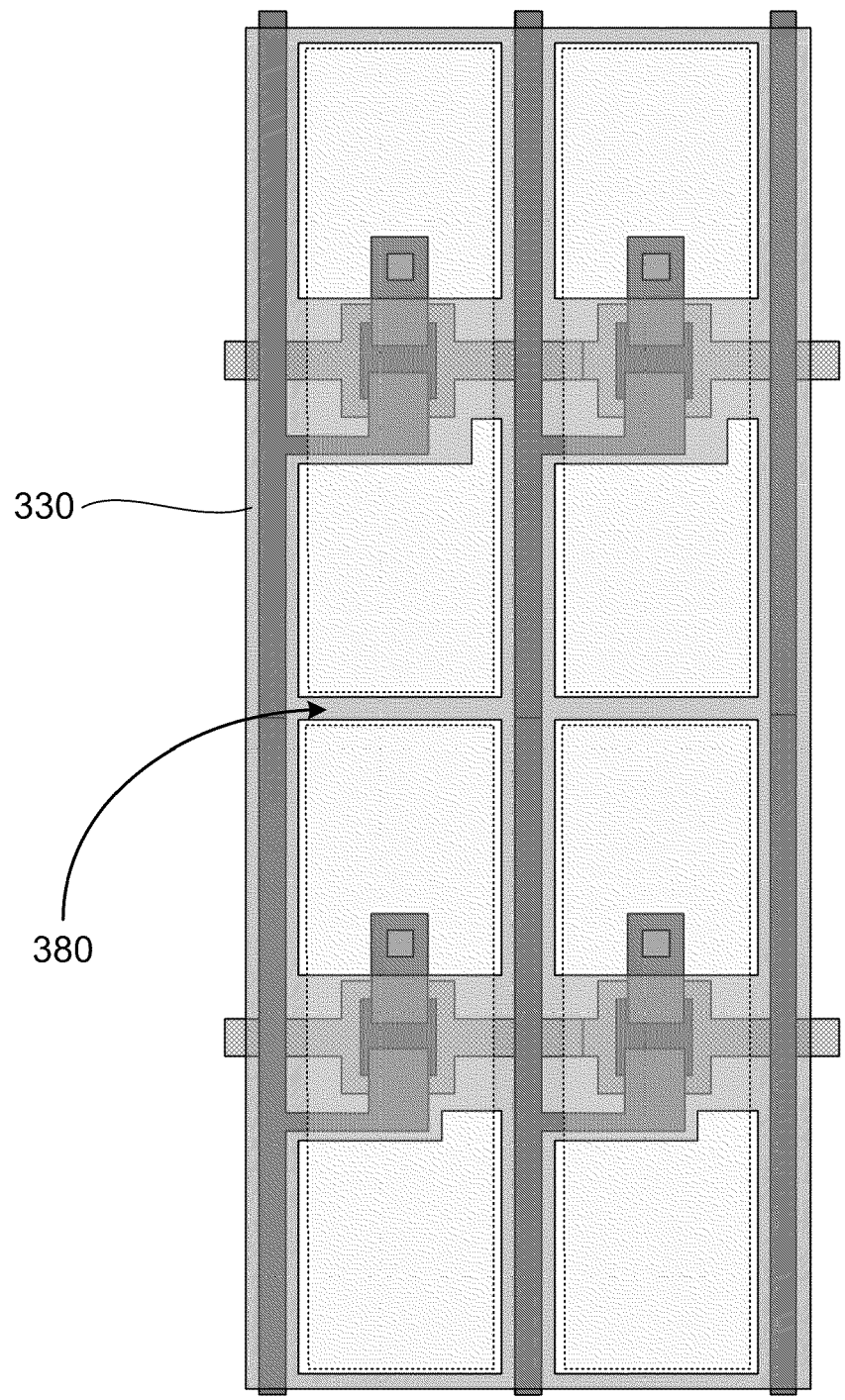
FIG. 3 shows partially a pixel design including 4 pixels according to another embodiment of the present invention.

FIG. 3 shows a pixel design 300 according to another embodiment of the present invention. The pixel design 300 is similar to the pixel design 200 shown in FIG. 2, excerpt that a portion of the shielding electrode 330 is formed in the first space 380.

Figure 4:
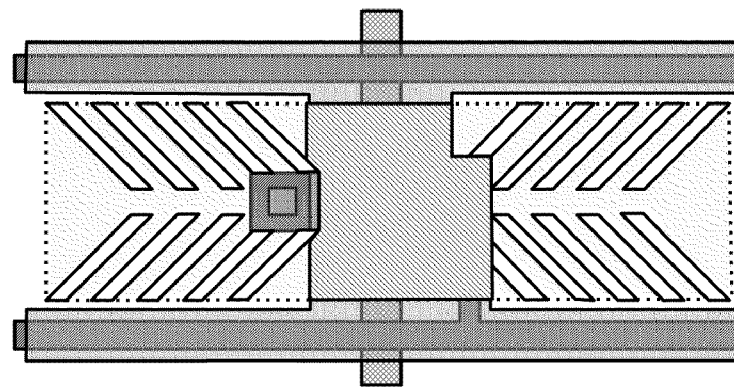
FIG. 4 shows schematically a pixel structure according to another embodiment of the present invention, (a) a top view, and (b) a top view with highlighting a storage capacitance.
Figure 4:
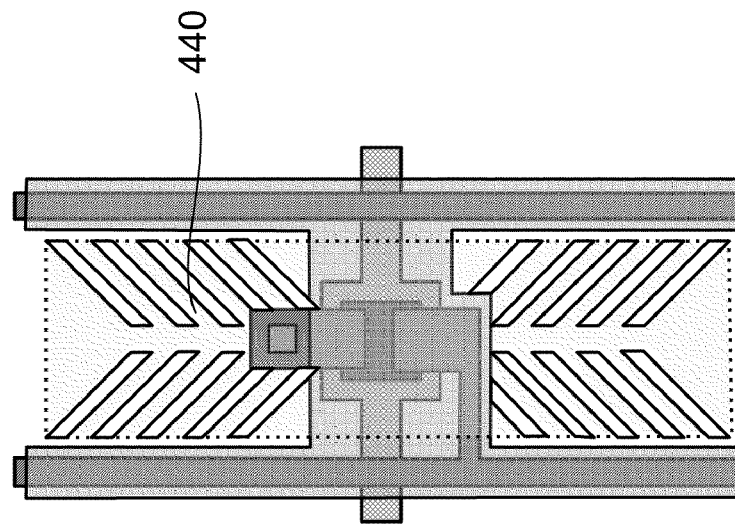
Figure 5A:
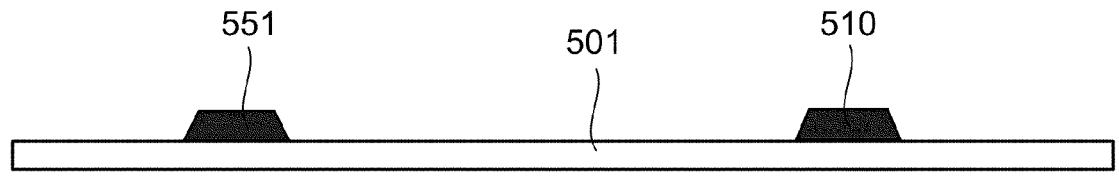
FIGS. 5a-5h show schematically cross-sectional views illustrating a method for fabricating a pixel structure according to one embodiment of the present invention.
Figure 5B:
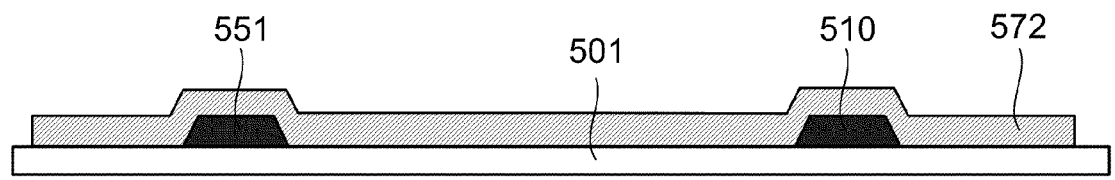
Figure 5C:
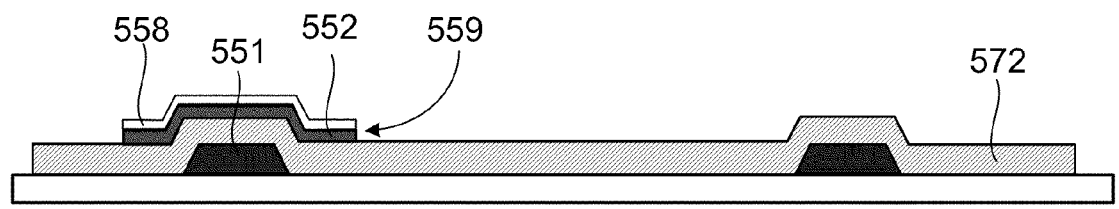
Figure 5D:
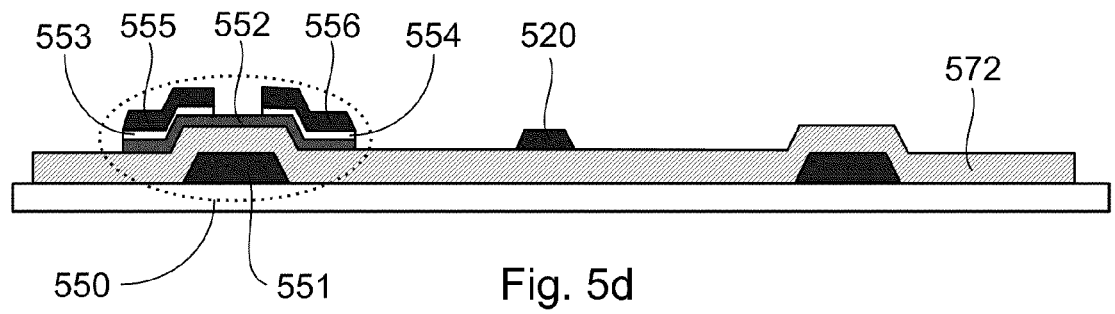
Figure 5E:
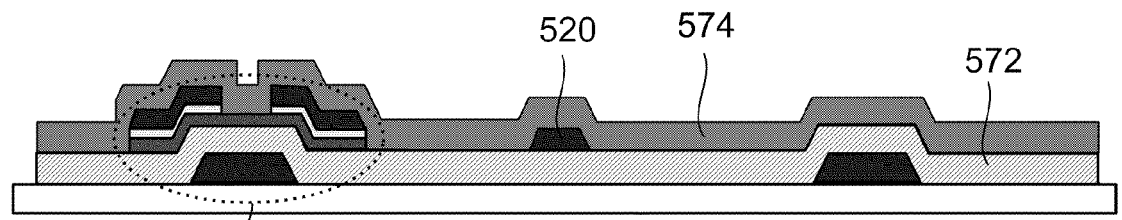
Figure 5F:
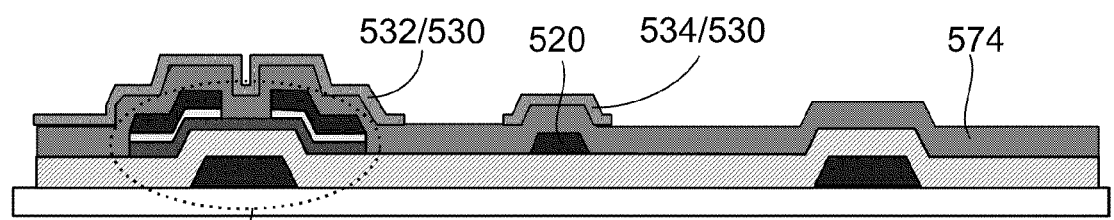
Figure 5G:
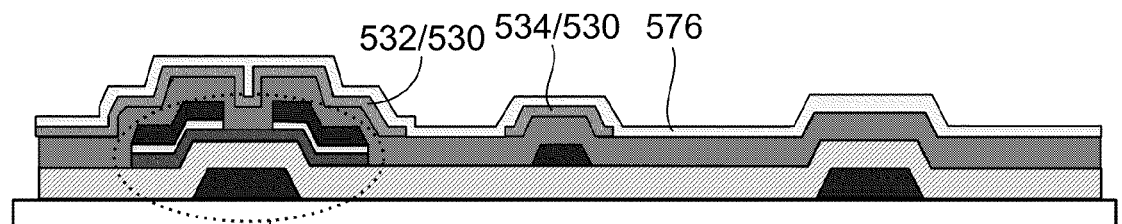
Figure 5H:
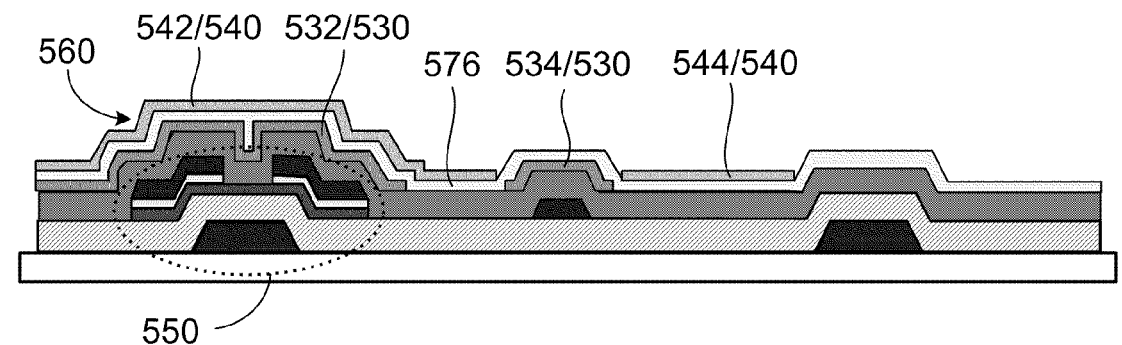
Figure 6:
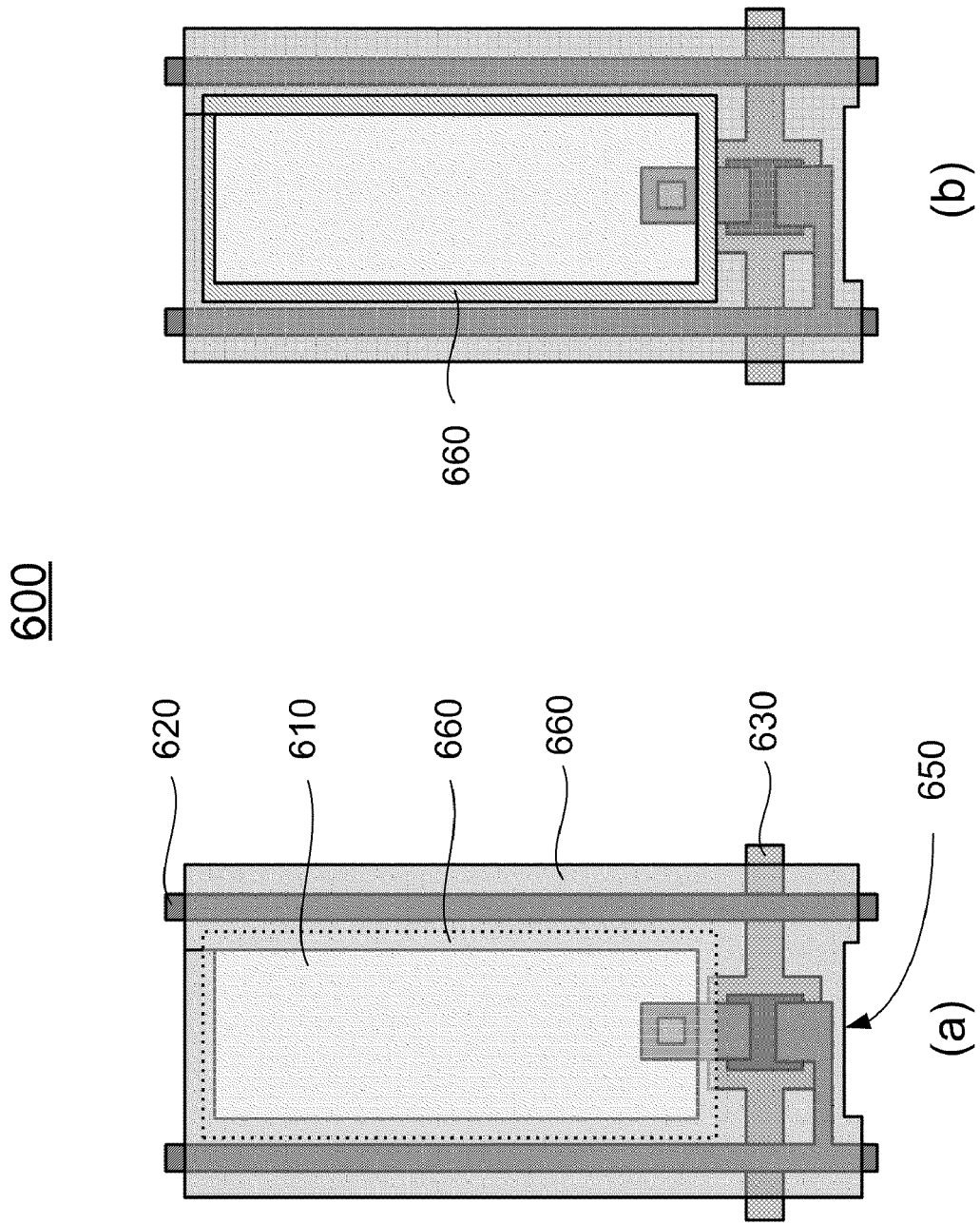
FIG. 6 shows schematically a conventional pixel structure, (a) a top view, and (b) a top view with highlighting a storage capacitance.
Figure 7:
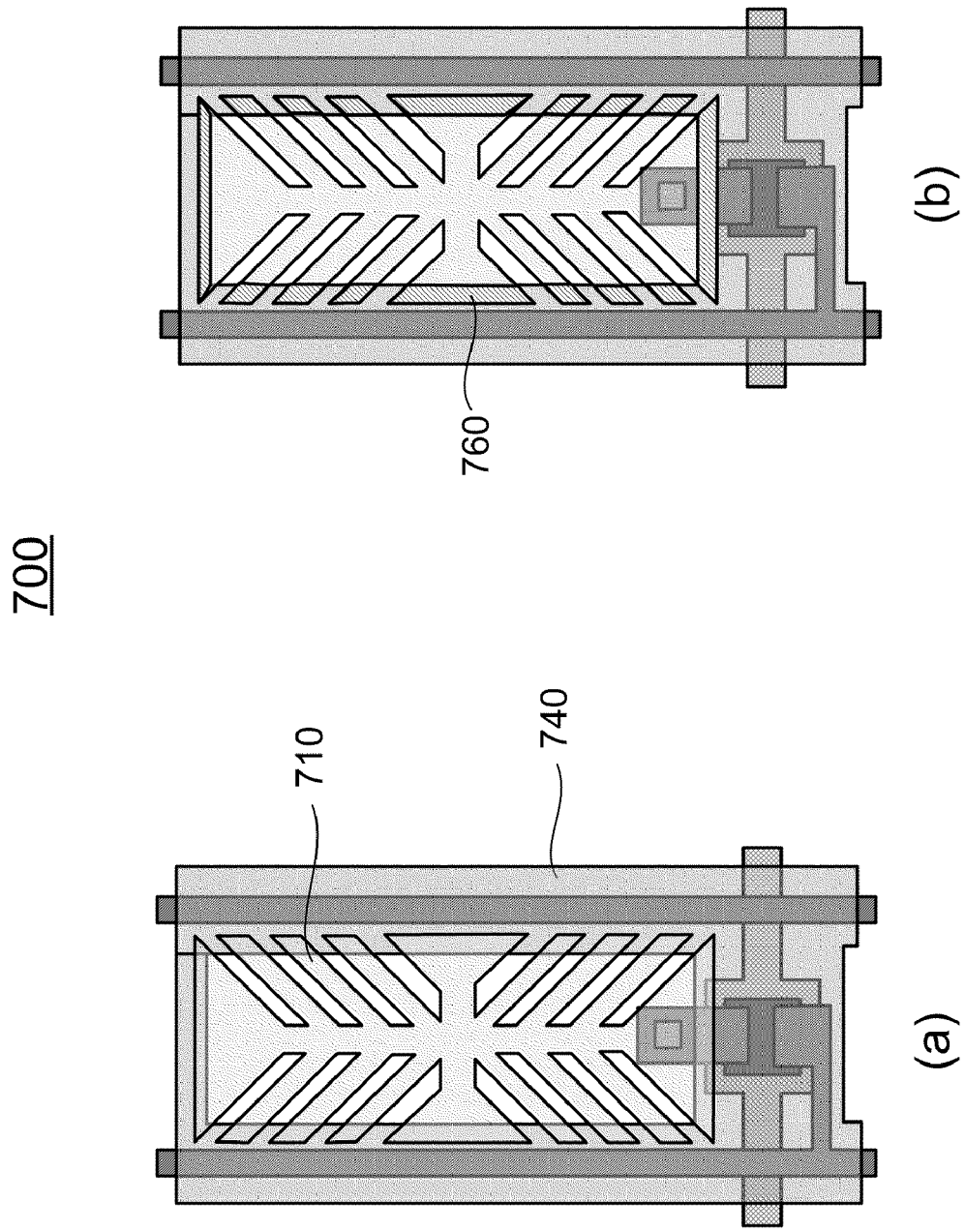
FIG. 7 shows schematically another conventional pixel structure, (a) a top view, and (b) a top view with highlighting a storage capacitance.

Referring to FIG. 4, a pixel structure 400 is shown according to another embodiment of the present invention. The pixel structure 400 is similar to the pixel structure 100 shown in FIGS. 1*a*-1*c*, excerpt that the pixel electrode 440 has a comb-like structure. Accordingly, for such a pixel structure 400, the aperture ratio of the pixel can be improved.

FIGS. 5*a*-5*h* show a method of fabricating a pixel structure according to one embodiment of the present invention. The method includes the following steps: at first, a substrate 501 is provided. The first substrate 501 is formed of glass, plastic or the likes. Then, a scan line 510 and a gate electrode 551 are spatially formed on the substrate 501. The gate electrode 551 is formed of a metal such as Al, Mo, Cr, Ta, or alloy, and electrically connected to the scan line 510.

A first insulation layer (gate insulation layer) 572 is formed on the substrate 501, and overlays the scan line 510 and the gate electrode 551. The first insulation layer 572 is formed of $SiN_x$, $SiO_x$, or SiON.

Then, a semiconductor layer 559 is formed on the first insulation layer 572. The semiconductor layer 559 includes a channel layer 552 formed on the first insulation layer 572 and overlapped with the gate electrode 551, and an ohmic contact layer 558 formed on the channel layer 552 and patterned to have a first contact portion 553 and a second contact portion 554 separated from the first contact portion 553. The channel layer 552 can be formed of amorphous silicon (a-Si) or the like. The contact layer 558 can be formed of doped amorphous silicon such as $N^+$ doped a-Si. In one embodiment, the channel layer 552 and the contact layer 558 are formed in such a manner that the a-Si and the doped amorphous silicon ($N^-$ doped a-Si or $P^+$ doped a-Si) are successively deposited by PECVD and then patterned. Next, a data line 520 and a source electrode 555 and a drain electrode 556 are formed. The source electrode 555 and the drain electrode 556 are formed on the first portion 553 and the second portion 554 of the ohmic contact layer, respectively. In alternative steps, after forming the channel layer 552 and the ohmic contact layer 558, a step of pre-patterning the channel layer 552 and the ohmic contact layer 558 can be performed to define the shape of the channel layer 552. A step of patterning the channel layer 552 and the ohmic contact layer 558 can be performed after forming the source electrode 555 and the drain electrode 556, wherein the ohmic contact layer 558 is patterned to have a first contact portion 553 and a second contact portion 554 separated from the first contact portion 553, and the source electrode 555 and the drain electrode 556 are substantially in contact with the first contact portion 553 and the second contact portion 554 of the ohmic contact layer 558, respectively. In further alternative steps, a half-tone process is employed, the step of patterning the channel layer 552 and the ohmic contact layer 558 can be performed after forming the source electrode 555 and the drain electrode 556 with a half-tone mask, wherein the ohmic contact layer 558 is patterned to have the first contact portion 553 and the second portion 554 separated from the first contact portion 553, and the source electrode 555 and the drain electrode 556 are substantially in contact with the first contact portion 553 and the second contact portion 554 of the ohmic contact layer 558, respectively.

The source electrode 555 and the drain electrode 556 of the switch 550 are electrically connected to the data line 520 and the pixel electrode 540. The gate electrode 551, the gate insulation layer 572, the channel layer 552, the ohmic contact layer 558, the source electrode 555 and the drain electrode 556 define a switch 550, which corresponds to a TFT.

Afterwards, a second insulation layer 574 is formed on the first insulation layer 572 and overlays the data line 520 and the switch 550. Then, a shielding electrode 530 is formed on the second insulation layer 574. The shielding electrode 530 has a first portion 532 overlapped with the switch 550, and a second portion 534 extending from the first portion 532 and overlapped with the data line 520. The shielding electrode 530 is formed of an opaque, conductive material.

The next step is to form a third insulation layer 576 on the second insulation layer 574, which overlays the shielding electrode 530. Then, a pixel electrode 540 is formed on the third insulation layer 576. The pixel electrode 540 has a first portion 542 and a second portion 544 extending from the first portion 342. The first portion 542 of the pixel electrode 540 is overlapped with the first portion 532 of the shielding electrode 530 so as to define a storage capacitor 560 with the third insulation layer 576 therebetween. The second portion 544 of the pixel electrode 540 is configured to have no overlapping area with the second portion 534 of the shielding electrode 530. The pixel electrode 540 is made of a transparent, conductive material.

In sum, the present invention, among other things, recites a pixel structure having a switch, a shielding electrode, and a pixel electrode formed inside the pixel area in a multilayered structure. The first portion of the shielding electrode and the first portion of the pixel electrode located over the switch and the third insulation layer therebetween are configured as a storage capacitor to generate a storage capacitance. Furthermore, the second portion of the pixel electrode has no overlapping with the second portion (located over the data line) of the shielding electrode. Accordingly, the pixel area can be optimally utilized to transmit light therethrough the pixel electrode, thereby increasing the aperture ratio of the pixel.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A pixel structure usable in a liquid crystal display (LCD), comprising:
   (a) a scan line formed on a substrate;
   (b) a data line formed over the substrate;
   (c) a pixel area associated with the scan line and the data line;
   (d) a switch formed inside the pixel area on the substrate;
   (e) a shielding electrode having a first portion and a second portion extending from the first portion, and formed over the scan line, the data line and the switch, wherein the first portion is overlapped with the switch, and wherein the second portion is overlapped with the data line wherein the first and second portions are formed adjacent and over the switch; and
   (f) a pixel electrode having a first portion and a second portion extending from the first portion, and formed over the shielding electrode in the pixel area, wherein the first portion is overlapped with the first portion of the shielding electrode so as to define a storage capacitor therebetween, and wherein the second portion has no overlapping with the second portion of the shielding electrode, wherein the switch has a gate, a source and a drain electrically connected to the scan line, the data line and the pixel electrode, respectively.

2. The pixel structure of claim 1, further comprising:
   (a) a first insulation layer formed between the scan line and the data line;
   (b) a second insulation layer formed between the data line and the shielding electrode; and
   (c) a third insulation layer formed between the shielding electrode and the pixel electrode.

3. The pixel structure of claim 2, wherein the gate of the switch is formed on the substrate, and the source and drain of the switch are formed between the first insulation layer and the second insulation layer.

4. The pixel structure of claim 3, wherein the switch further comprises a semiconductor layer formed between the source and drain and the first insulation layer.

5. The pixel structure of claim 4, wherein the semiconductor layer comprises a channel layer formed on the first insulation layer and an ohmic contact layer formed on the channel layer.

6. The pixel structure of claim 5, wherein the channel layer is formed of amorphous silicon (a-Si), and wherein the ohmic contact layer is formed of an $N^+$ doped or CVD deposited semiconductor.

7. The pixel structure of claim 1, wherein the switch comprises a thin film transistor.

8. The pixel structure of claim 1, wherein the second portion of the shielding electrode is configured to shield the electric field produced from the data line.

9. The pixel structure of claim 1, wherein the shielding electrode is made of an opaque, conductive material.

10. The pixel structure of claim 1, wherein the pixel electrode has a comb-like shape.

11. The pixel structure of claim 1, wherein the pixel electrode is made of a transparent, conductive material.

12. A liquid crystal display (LCD) comprising a plurality of the pixel structures of claim 1, arranged in a matrix.

* * * * *